United States Patent [19]
Guillon et al.

[11] Patent Number: 5,585,993
[45] Date of Patent: Dec. 17, 1996

[54] SOLID STATE SWITCH WITH INTEGRAL PROTECTION FOR CONNECTING A LOAD TO AN ELECTRICAL POWER SUPPLY AND INCORPORATING AN ISOLATED GATE BIPOLAR TRANSISTOR

[75] Inventors: Laurent Guillon, Panazol; Didier Tassel, Quesnoy-Sur-Deule, both of France

[73] Assignee: Legrand S.A., Limoges, France

[21] Appl. No.: 566,598

[22] Filed: Dec. 4, 1995

Related U.S. Application Data

[63] Continuation of Ser. No. 180,996, Jan. 14, 1994, abandoned.

[30] Foreign Application Priority Data

Jan. 15, 1993 [FR] France .................... 93-00347

[51] Int. Cl.⁶ ........................................ A02H 3/00
[52] U.S. Cl. ........................................ 361/93; 361/18
[58] Field of Search ................. 361/18, 93, 94, 361/54, 56, 57

[56] References Cited

U.S. PATENT DOCUMENTS

| | | | |
|---|---|---|---|
| 4,065,804 | 12/1977 | Rostad | 361/96 |
| 4,297,741 | 10/1981 | Howell | 361/93 |
| 4,371,824 | 2/1983 | Gritter | 361/18 |

*Primary Examiner*—Jeffrey A. Gaffin
*Assistant Examiner*—Sally C. Medley
*Attorney, Agent, or Firm*—Greenblum & Bernstein P.L.C.

[57] ABSTRACT

A solid-state switch is connected in series with a load between the poles of an electrical power supply. It includes an isolated gate bipolar transistor with an emitter connected to the internal ground and connected to the load and a collector connected to one pole of the supply and driving an input of a subtractor the other input of which is connected to receive a set point voltage. The output of the subtractor drives a feedback system connected to the gate of the transistor. The voltage at the gate is then representative of the current in the switch and is applied to interrupter means which sends a turn-off signal if the gate voltage exceeds a (triggering) threshold value. The turn-off signal sends to a switching circuit a turn-off voltage which produces a turn-off bias and disables the feedback circuit.

8 Claims, 1 Drawing Sheet

SOLID STATE SWITCH WITH INTEGRAL PROTECTION FOR CONNECTING A LOAD TO AN ELECTRICAL POWER SUPPLY AND INCORPORATING AN ISOLATED GATE BIPOLAR TRANSISTOR

This application is a continuation, of application Ser. No. 08/180,996, filed Jan. 14, 1994, now abandoned.

BACKGROUND OF THE INVENTION

1. Field of the Invention

The invention concerns a solid-state switch with integral protection for connecting a load to an electrical power supply and including at least one isolated gate bipolar type transistor with an emitter-collector space through which a unidirectional current flows from the supply to the load, the transistor having (taking the emitter potential as the origin) an emitter-collector current which is a function of the gate voltage and beyond a saturation voltage substantially independent of the collector voltage and interrupter means connected to the gate responsive to an electrical quantity derived from the current flowing through the switch and adapted to apply a turn-off bias to the gate in response to the current exceeding a specific value.

2. Description of the Prior Art

As compared with conventional electromagnetically controlled switches with mechanical interruption of the current, solid-state switches have the advantages that they do not include any moving parts, which makes them silent, fast and virtually wear-free, and do not generate sparks when they operate; also, with an alternating current supply it is a simple matter to synchronize them to the supply in order to close the switch at zero voltage and to open it at zero current, which significantly reduces radiated electromagnetic interference. On the other hand, the semiconductor devices of solid-state switches are usually less able to withstand overcurrents, because of internal voltage drops in particular, and blocking the current often becomes increasingly difficult as the current to be interrupted increases, so that they are not well suited to interrupting high overcurrents. Finally, the characteristics of such semiconductor devices are usually highly dependent on their internal temperature which can cause problems with adjusting the switching thresholds.

The technician is faced with various types of semiconductor device which can operate in a controlled manner on a current flowing through them. These include thyristors and triacs, GTO thyristors, MOS transistors, conventional bipolar transistors and isolated gate bipolar transistors.

Thyristors and triacs have a good resistance to overcurrents and low internal voltage drops when conducting. However, they have the major drawback that they cannot be turned off; they cease to conduct only after the current through them is interrupted. They can be used only with alternating current supplies, and cannot achieve fast switching, especially if the load or the supply includes any reactive components. These a devices also have a restoration time after passing current during which application of a voltage is likely to turn them on again. This restoration time, associated with the neutralization of charges generated by the flow of the current (avalanche current), increases with the current flowing in the moments before cancellation. These devices are therefore ill suited to applications with integral protection.

The resistance to overcurrents may be severely compromised if the switching time is relatively long, thermal energy losses increasing with the switching time.

GTO thyristors can be turned off by injecting charges into the trigger but in practise are no better suited to integral protection as the quantity of charge to be injected into the trigger increases in proportion to the current to be interrupted, to a first approximation. Integral protection will then fail in the event of a high overcurrent, just when it is of particular utility.

MOS transistors can be turned off with minimum control energy input and, in the saturated (on) state, have a low source-drain voltage which is also approximately proportional to the current through them, so that the source-drain space of the MOS transistor can be used as an overcurrent sensor at the input of interrupter means. However, although MOS transistors withstand overcurrents well, all the more so in that the switching time can be very short, their nominal current density is limited with the result that the switches would be bulky if the power passing through them were not low. Also, MOS transistors are the most costly of the semiconductor devices mentioned above, for the same nominal power rating.

The conventional bipolar transistor is compact and low in cost; it is easy to turn off. However, it is only moderately resistant to overcurrents, which would require it to be uprated. The control power needed to saturate it (turn it on) is relatively high if a low internal emitter-collector voltage drop is required, to reduce losses in normal operation; however, the power required to turn it off in response to an overcurrent is then not negligible. The low voltage drop between the emitter and the collector can hardly be used to detect overcurrents as it varies significantly with temperature.

The isolated gate bipolar transistor has most of the advantages of a base-controlled bipolar transistor, including its low cost and small size. Because it is controlled by way of its isolated gate, it shares with the MOS transistor the advantages of resistance to overcurrents and of simplicity of control, the gate absorbing energy only during switching. However, it cannot withstand high reverse voltages, which means that precautions are necessary if the load and the supply are such that switching is likely to generate reverse voltages (anti-parallel diodes with appropriate characteristics).

In this regard, all controlled semiconductor devices except triacs are one-way conduction devices and cannot be used with full-wave alternating current electrical power supplies except in appropriate circuits, and then either in pairs whereby each device operates on one half-wave or in a circuit in which the device has the current flow through it in the same direction for both half-waves.

However, the isolated gate bipolar transistor does not have the MOS property which favors the use of integral protection, namely the fact that the internal voltage drop is substantially proportional to the current flowing through the source-drain space. Taking the emitter potential as the origin, the emitter-collector current is a function of the gate voltage and, beyond a saturation voltage, substantially independent of the collector voltage.

It is easy to see that the collector voltage is not an appropriate image of the current through the emitter-collector space because of the dependence of the gate voltage. Also, the saturation voltage varies with the temperature of the semiconductor.

The use of a series impedance in the switch to derive an interrupter means control voltage would have the drawback of increasing the voltage drop in the switch and increasing the overall size of the device.

The problem to be solved by the invention is to produce a solid-state switch with integral protection including an isolated gate bipolar transistor in which the quantity derived from the current flowing through the switch is sampled at the transistor itself and enables the specific value beyond which turn-off occurs to be appropriately representative of the overcurrent threshold at which interruption should occur.

SUMMARY OF THE INVENTION

To achieve this object the invention proposes a solid-state switch with integral protection for connecting a load to an electrical power supply including at least one isolated gate bipolar transistor with an emitter-collector space through which a unidirectional current flows from the supply to the load, the transistor having, taking the emitter potential as the voltage origin, an emitter-collector current which is a function of the gate voltage and beyond a saturation voltage substantially independent of the collector voltage and interrupter means connected to the gate responsive to a quantity derived from the current flowing through the switch and adapted to apply a turn-off bias to the gate in response to the current exceeding a specific value, which switch includes a feedback circuit preceded by a subtractor receiving on a first input the collector voltage and on a second input a set point voltage and supplying to the gate a feedback voltage such that the feedback circuit tends towards equilibrium.

Taking a voltage substantially equal to the saturation voltage at the nominal current and at the normal operating temperature as the set point voltage, steady-state operating conditions are achieved corresponding to minimal losses. However, any increase in current beyond the nominal current which would, in the absence of feedback, have the effect of considerably increasing the collector voltage causes the gate voltage to be adjusted to the value corresponding to maintaining the saturated (on) state of the transistor at the increased current, virtually regardless of the overcurrent that is present. The range of gate voltages corresponding to the difference between the nominal current and the likely peak current is wide and the specific value beyond which the interrupter means operate is sufficiently precise to provide the necessary protection without causing interruption on overcurrents which are not hazardous to the load.

The set point voltage preferably includes a component delivered by a temperature sensor coupled to the transistor. In this way the set point voltage can be adapted to allow for variations with temperature in the saturation voltage.

The interrupter means preferably include switching means between the feedback circuit and the gate of the transistor adapted to substitute the turn-off bias voltage for the feedback voltage in response to the feedback voltage exceeding a voltage threshold; this achieves very fast switching.

The interrupter means preferably include time-delay means connected to a voltage threshold generator so that the voltage threshold decreases with time according to a fixed law. Loads such as motors and incandescent lamps frequently draw a current when they are switched on which is very much greater than the steady-state current. It is therefore useful if the switch accommodates transient overcurrents whose magnitude is inversely proportional to their duration. Conventional electromagnetic overcurrent sensor-equipped switches utilize the inertia of the moving parts to obtain a characteristic of this kind; in an entirely semiconductor-based arrangement it is possible to choose a fixed decreasing law tailored exactly to requirements.

If the electrical supply is an alternating current voltage supply such as the AC line voltage, the isolated gate bipolar transistor must be associated with rectifier components, firstly to avoid application to the transistor of high reverse voltages that it is not able to withstand, and secondly to use the two half-periods of the alternating current in order not to communicate to the supply a direct current component. There are two preferred circuits:

Either two isolated gate transistors are used connected in series by the respective emitters and two diodes each having its anode connected to the emitters and its cathode connected to the collector of a respective one of the two transistors. In this way on each half-wave the current flows through one diode and the transistor associated with the other diode.

Or only one isolated gate transistor is used in a direct current output diagonal of a rectifier bridge with four diodes the alternating current input diagonal of which is connected between the source and the load. In this way the transistor carries a unidirectional current which it can interrupt during either half-wave of the supply. Note, however, that this circuit means that the internal voltage drop in the switch corresponds to the sum of the internal voltage drops of three semiconductor components, namely the transistor and the two diodes.

If the circuit with two transistors and two diodes is used, it is preferable for each collector of the transistors to be connected to the first input of the subtractor by a respective forward-biased diode. This circuit is equivalent to an OR gate and the first input of the subtractor receives the higher collector voltage. The collector voltage of the transistor which is turned on cannot be less than the saturation voltage. The collector voltage of the transistor which is turned off is the voltage drop in the associated diode, which is less than the saturation voltage. It is therefore possible to use only one subtractor and only one feedback circuit for both transistors.

The switch often has on and off controls. As the isolated gate bipolar transistor control circuits require their own direct current supply independent of the switch and this supply is derived from the alternating current supply, a zero voltage detector and a current detector may be provided and the on control enabled at the zero voltage and the off control enabled at the zero current. These arrangements introduce a time-delay in response to on or off commands which is in all cases less than 10 milliseconds for a 50 Hz supply and limit interference fed back into the supply.

Secondary features and advantages of the invention emerge from the following description given by way of example with reference to the appended drawings.

DETAILED DESCRIPTION OF THE INVENTION

Figure 1:
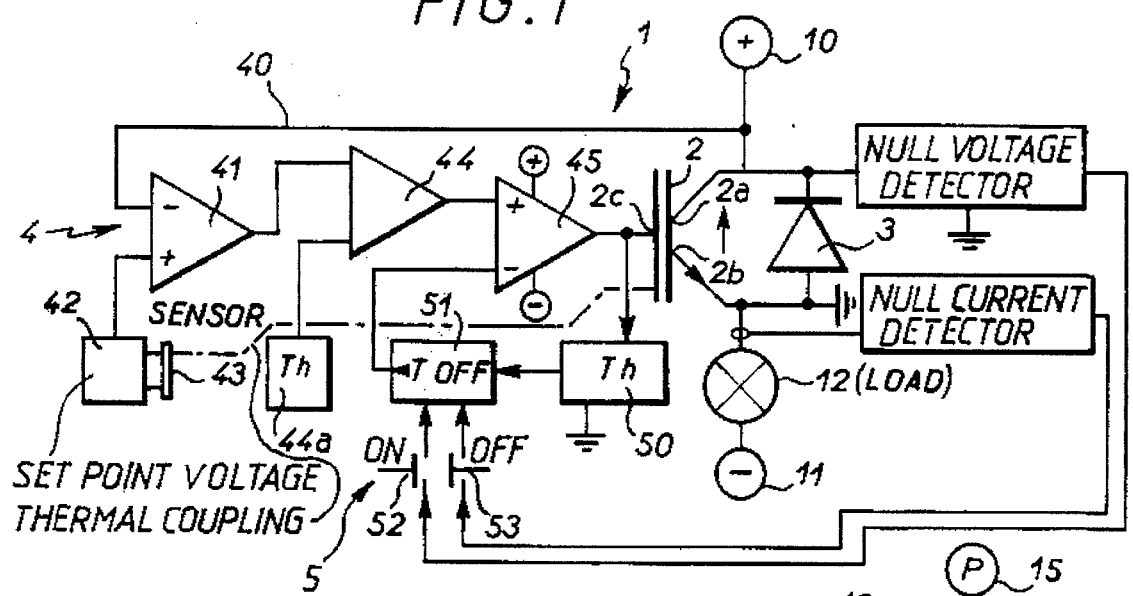
FIG. 1 is a block diagram showing the essentials of the invention.

In the embodiment shown in FIG. 1 a switch 1 includes, between the positive pole 10 and negative pole 11 of a direct current voltage supply, an isolated gate bipolar transistor 2 in series with a load 12 such as a motor or a conventional incandescent lamp or halogen lamp. The isolated gate bipolar transistor (IGBT) 2 has a collector 2a, an emitter 2b and a gate 2c isolated from the emitter-collector junction. Because of the low reverse breakdown voltage inherent to this type of transistor a diode 3 has its anode connected to the emitter 2b and its cathode connector to the collector 2a. The internal ground of the switch is connected to the emitter 2b, the potential at which is taken as the voltage origin.

A conductor 40 connects the collector 2a to an inverting first input of an operational amplifier 41 configured as a subtractor which receives on its non-inverting second input a reference voltage from a supply 42 having a heat sensor 43 in contact with the heatsink on which the IGBT 2 is mounted. To simplify FIG. 1 this thermal contact is not shown.

The output of the subtractor 41 drives the non-inverting input of a second operational amplifier 44 which operates as a shifter by adding a positive threshold voltage 44a to the output voltage of the subtractor 41 with the result that its output signal varies between this threshold voltage and a maximal positive voltage in response to a subtractor output signal varying between zero and a positive value. This ensures that the IGBT 2 is saturated even for emitter-collector currents tending towards zero.

The output voltage of the shifter amplifier is applied to the direct input of an amplifier 45. A positive turn-off signal from a turn-off signal generator circuit 51 specifically designed for controlling the IGBT 2 may be applied to the inverting input of this amplifier. Here the turn-off signal is a positive signal of sufficient amplitude to reduce the output voltage of the amplifier 45 to a negative or turn-off bias value sufficient to turn off the IGBT 2 regardless of the positive voltage applied to the non-inverting input of the amplifier 45. The latter therefore has a switching function, the signal from the subtractor 41 being obtained, amplified, and shifted at the output of the amplifier 45 if there is no turn-off signal, this turn-off signal in the form of a turn-off bias having priority over the amplified and shifted output voltage of the subtractor 41.

The subtractor 41, the shifter amplifier 44 and the switching amplifier 45 together constitute a feedback circuit 4 which applies to the gate 2c of the IGBT 2 a feedback signal or voltage which is a function of the difference between the collector voltage 2a on the line 40 and the set point voltage from the supply 42. This feedback voltage is such that the current flowing through the IGBT from the emitter 2b to the collector 2a is varied in such a way that the collector voltage balances the reference voltage; the reference voltage is chosen to correspond substantially to the linear operating area of the IGBT 2 without reaching the saturation voltage. If an overcurrent occurs the feedback circuit reacts by increasing the gate voltage to shift the collector voltage that is equilibrium towards the set point voltage.

The gate voltage 2c is representative of the current through the emitter-collector space of the IGBT 2.

The switch 1 includes interrupter means 5 which are constituted by a threshold circuit 50 and the turn-off signal generator 51. The gate voltage 2c is applied to the threshold circuit 50 which sends an interruption signal to the turn-off signal generator 51 if the gate voltage 2c exceeds a specific value corresponding to a current flowing through the transistor at the tolerable limit.

The turn-off signal generator 51 operates like a bistable which is set by the command 52 in response to the sending of a turn-on signal, to cancel a positive turn-off signal at the inverting input of the amplifier 44, and is reset in response either to a turn-off signal (command 53) or in response to an interruption signal (threshold 50), such resetting resulting in the sending of a turn-off positive signal.

The threshold circuit 50 may include a plurality of thresholds associated with time-delay means so that the threshold voltage decreases with time. Three staggered turn-off thresholds are provided, for example, with corresponding time-delays during which each of the currents corresponding to a respective threshold is tolerable. If the lowest threshold is exceeded the time-delays are started and the turn-off signal is sent if any of the thresholds is still exceeded at the end of the associated time-delay. The sending of the turn-off signal clears the time-delays, along with the end of the longest time-delay, if no turn-off signal is sent.

FIG. 1 shows a switch designed to connect a load to a direct current voltage supply; this arrangement has been described first because it is a simpler arrangement; it is more usual, however, for the switches to be designed for use with alternating current supplies, such as an AC line voltage.

Figure 2:
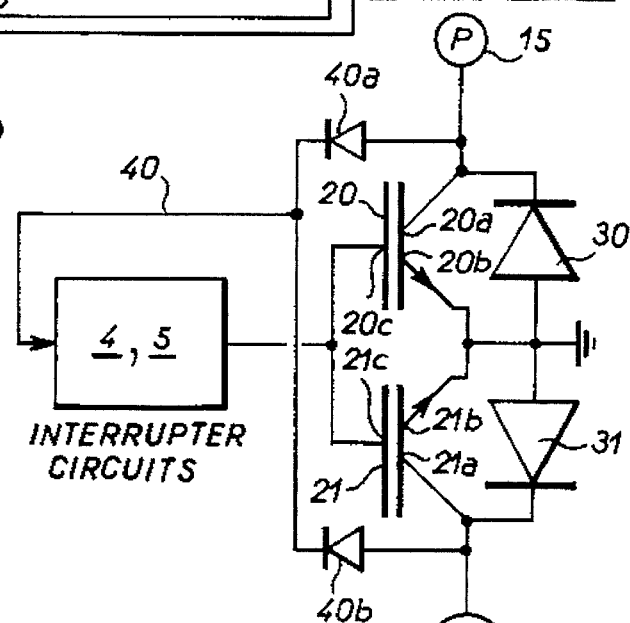
FIG. 2 is a block diagram of a circuit with two transistors for an alternating current electrical power supply.

FIG. 2 shows a first circuit for connecting a load 12 to an alternating current supply having a live pole 15 and a neutral pole 16. The load 12 is connected between the switch and the neutral pole.

The switch includes two IGBT 20 and 21 with respective collectors 20a and 21a, emitters 20b and 21b, and gates 20c and 21c. The IGBT 20 and 21 are connected in series between the live pole 15 and the supply 12 with their emitters 20b, 21b connected together and to the internal ground of the switch. Two diodes 30 and 31 have their anode connected to the emitters 20b and 21b and their cathodes respectively connected to the collectors 20a and 21a of the transistors 20 and 21. During one half-wave the current flows from the live pole 15 to the neutral pole 16 through the IGBT 20, the diode 31 and the load 12. During the other half-wave it flows from the neutral pole 16 to the live pole 15 through the load 12, the IGBT 21 and the diode 30. Note that during the first half-wave the transistor 21 is short-circuited by the diode 31 and that during the second half-wave the transistor 20 is short-circuited by the diode 30, with the result that the reverse voltages applied to the IGBTs are reduced to the voltage drops in the forward-biased diodes.

The collectors 20a and 21a are connected to the feedback line 40 by respective diodes 40a and 40b which are equivalent to an OR gate. The collector voltage of the transistor which is turned on is greater than the voltage drop in the forward-biased diode with the result that the line 40 is at all times at the collector voltage of the IGBT which is turned on. The circuit 4, 5 is equivalent to the feedback circuit 4 and interrupter circuit 5 described with reference to FIG. 1 with the result that the gate voltages of the two transistors 20 and 21 are at all times the same, whether it is necessary to vary the current through the transistor which is turned on so that the collector voltage tends towards the set point voltage or to turn off the transistors for the conducting direction, depending on the supply half-wave.

Note that when the switch is closed, i.e. allowing current to flow from the supply to the load, the transistor which is in the turned off direction for one half-wave receives at its gate a positive voltage; however, there is no drawback to this because the gate is isolated and the voltage between the emitter and the collector is limited by the diode connected in the forward-biased direction between these electrodes.

Figure 3:
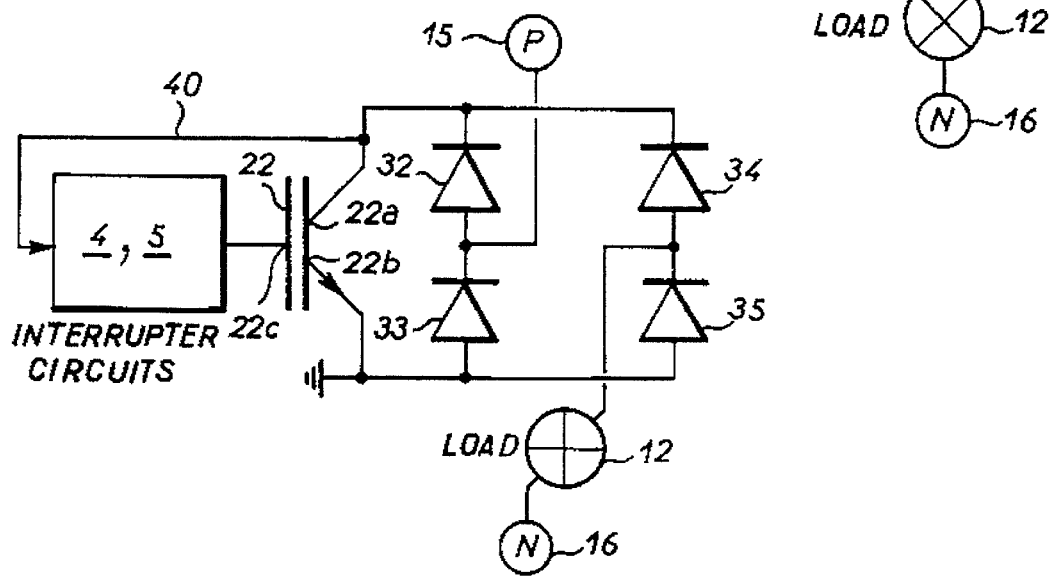
FIG. 3 is a block diagram of an alternative circuit for an alternating current electrical power supply using a single transistor associated with a rectifier bridge.

The variant shown in FIG. 3 uses a single IGBT 22 with a collector 22a, an emitter 22b connected to the internal ground of the switch and a gate 22c. The feedback and interrupter circuits 4, 5 have a connection 40 to the collector 20a and a connection to the gate 22c with the same arrangement as in FIG. 1.

A rectifier bridge with four diodes 32, 33, 34, 35 has an alternating current input diagonal between a vertex between the anode of the diode 32 and the cathode of the diode 33 connected to the live pole 15 of the alternating current supply and a vertex between the anode of the diode 34 and the cathode of the diode 35 connected to the load 12 in turn connected to the neutral pole 16 of the alternating current supply. The bridge also has a direct current output diagonal between a vertex to which the anodes of the diodes 33 and 35 are connected, connected to the emitter 22b of the IGBT and to the internal ground, and a vertex to which the cathodes of the diodes 32 and 34 are connected, connected to the collector 22a. It is immediately apparent that although the current flowing from the supply 15, 16 to the load 12 is an alternating current, the current which flows through the transistor 22 is a unidirectional current.

Compared to the circuit shown in FIG. 2, the circuit of FIG. 3 has the advantage of using only IGBT, at the cost of requiring four diodes instead of two, and the current flows through three semiconductor components (one IGBT and two diodes) rather than two (one IGBT and one diode). The requirement to minimize losses leads to the choice of diodes with low internal voltage drops. Note, however, that the diode reverse voltage requirement is reduced by half.

The components of the feedback circuit 4 and interrupter circuit 5 naturally require a low-power direct current supply, derived from the same alternating current supply 15, 16 as the supply to the load. It is beneficial for the turn-on and turn-off controls 52, 53 respectively to close the switch at zero voltage and to open it at zero current, in order to limit transients due to the reactive components of the load 12 and of the supply 15, 16.

To this end the turn-off signal generator 51 is provided with a zero voltage detector which enables the turn-on control 52 when the voltage passes through zero and a null current detector which enables the turn-off control 53 when the current passes through zero.

The zero voltage and current detectors may be of any kind known to the person skilled in the art. In the case of the zero voltage detector, for example, a peak limiter amplifier can be connected to the output of the full-wave rectifier, on the input side of the smoothing filter, driving the light-emitter diode of an optocoupler at whose output a pulse appears in response to turning off of the LED. This pulse is applied to an input of an AND gate and the turn-on control is connected to a second input of this AND gate.

An analogous circuit between the feedback line 40 and ground detects a zero current and is ANDed with the turn-off control 53 to enable this control. The turn-off control 53 is symbolically represented by a normally-closed pushbutton, an analogy with the conventional means of controlling an electromagnetic switch. The turn-off control may in fact be of any kind at all, however, and in combination with an AND gate supplies a high state to command opening of the switch.

The invention is naturally not limited to the examples described but encompasses all variants thereof within the scope of the claims.

There is claimed:

1. Solid-state switch with integral protection for connecting a load to an electrical power supply including at least one isolated gate bipolar transistor having, in addition to said isolated gate, an emitter and a collector defining an emitter-collector space for unidirectional current flow from the supply to the load, said transistor having a gate voltage, an emitter voltage, a collector voltage and an emitter-collector current which is a function of the gate voltage and, beyond a saturation voltage, substantially independent of the collector voltage, the emitter voltage being taken as the reference potential, and interrupter means coupled to receive said gate voltage representative of said emitter-collector current flowing through the switch and adapted to apply a turn-off bias to said gate in response to said emitter-collector current exceeding a predetermined value, said switch including a feedback circuit having a subtractor as a first stage, said subtractor having a first input for receiving the collector voltage and a second input for receiving a set point voltage and for supplying to said gate a feedback voltage such that the feedback circuit causes said collector voltage to shift toward said set point voltage and thereby tends to maintain said switch in an operational condition.

2. Switch according to claim 1 wherein the set point voltage includes a component supplied by a temperature sensor thermally coupled to said transistor.

3. Switch according to claim 1 wherein said interrupter means include switching means between said feedback circuit and the gate of said transistor and adapted to substitute said turn-off bias for said feedback voltage in response to said feedback voltage exceeding a voltage threshold.

4. Switch according to claim 3 wherein said interrupter means include time-delay means connected to a voltage threshold generator so that the voltage threshold decreases with time according to a fixed law.

5. Switch according to claim 1 for an alternating current electrical power supply including two said isolated gate transistors connected in series by their emitters and two diodes each having its anode connected to said emitters and its cathode connected to the collector of a respective one of said two transistors.

6. Switch according to claim 5 wherein said collectors of said two transistors are each connected to said first input of said subtractor by a respective forward-biased diode.

7. Switch according to claim 5 having turn-on and turn-off controls and a zero supply voltage detector adapted to enable said turn-on control at zero voltage and a current detector adapted to enable said turn-off control at zero current.

8. Switch according to claim 1 for an alternating current electrical power supply including, in association with a single isolated gate transistor, a rectifier bridge having four diodes defining two diagonals, an alternating current input diagonal connected between said supply and said load and a direct current output diagonal connected to said emitter-collector space of said transistor.

* * * * *